April 4, 1950 O. E. WAGENKNECHT ET AL 2,502,682

TUNING MEANS

Filed Jan. 5, 1946

OTTO E. WAGENKNECHT
CLARENCE W. WANDREY
INVENTORS.

BY David M. Davis
Frank L. Mauritz
THEIR ATTORNEYS

Patented Apr. 4, 1950 2,502,682

UNITED STATES PATENT OFFICE 2,502,682

TUNING MEANS

Otto E. Wagenknecht, Chicago, and Clarence W. Wandrey, Wheaton, Ill., assignors to Zenith Radio Corporation, a corporation of Illinois Application January 5, 1946, Serial No. 639,360

4 Claims. (Cl. 74—10.1)

The present invention relates broadly to tuning arrangements in radio systems and may be used in any radio system where automatic tuning is desired, and especially in radio receiving systems mounted in an automobile wherein, for purposes of safety and convenience, the receiving system is controlled by foot or knee operation.

There are now in use by the public generally many radio receivers tuned selectively to receive predetermined frequencies upon operation of one of a plurality of corresponding push buttons or manuals. Also, in the past radio receiving systems were tuned sequentially in predetermined order to predetermined frequencies upon recurrent operation of a single control element. In the copending application S. N. 570,281 filed December 29, 1944, now Patent No. 2,435,522, of Otto E. Wagenknecht, one of the joint inventors herein, a radio receiving system is disclosed wherein tuning may be both of the selective and sequential nature. That is, in a system described in application S. N. 570,281, now Patent No. 2,435,522, either selective tuning may be accomplished by actuating one of a plurality of push buttons or manuals according to the wish of the operator to tune the receiving system to a corresponding predetermined frequency or sequential tuning may be accomplished by actuating recurrently a single control element thereby to tune the system to predetermined frequencies in predetermined order. The tuning system described herein is of the type described above in connection with the tuning system in such copending application S. N. 570,281, now Patent No. 2,435,522, but the constructional details, arrangement and combination of elements shown herein result in great simplification and economy in manufacture and operation of such a tuning system.

It is, therefore, an object of the present invention to provide an improved tuning arrangement in a radio system whereby such system may be tuned to predetermined frequencies either selectively or sequentially.

Another object of the present invention is to provide a selective sequential tuning arrangement in a radio system wherein electrical switching is reduced to a minimum and the need for a rotatable homing device of the type shown in the above mentioned copending application S. N. 570,281, now Patent No. 2,435,522, is no longer present.

Inasmuch as there are many so-called push button receivers on the market and the manufacturing technique for the corresponding push button units has been highly developed, it appears desirable to adapt such units for sequential tuning of the associated radio apparatus without interfering with the normal function of the push buttons to selectively tune such apparatus according to the particular wish of the operator.

A further object of the present invention is therefore to provide an arrangement for adapting present day push button tuned receivers for sequential tuning without interfering with the normal operation of the push buttons or manuals to selectively tune such receivers but yet making use of the present push button structure to produce sequential tuning.

Figure 1:
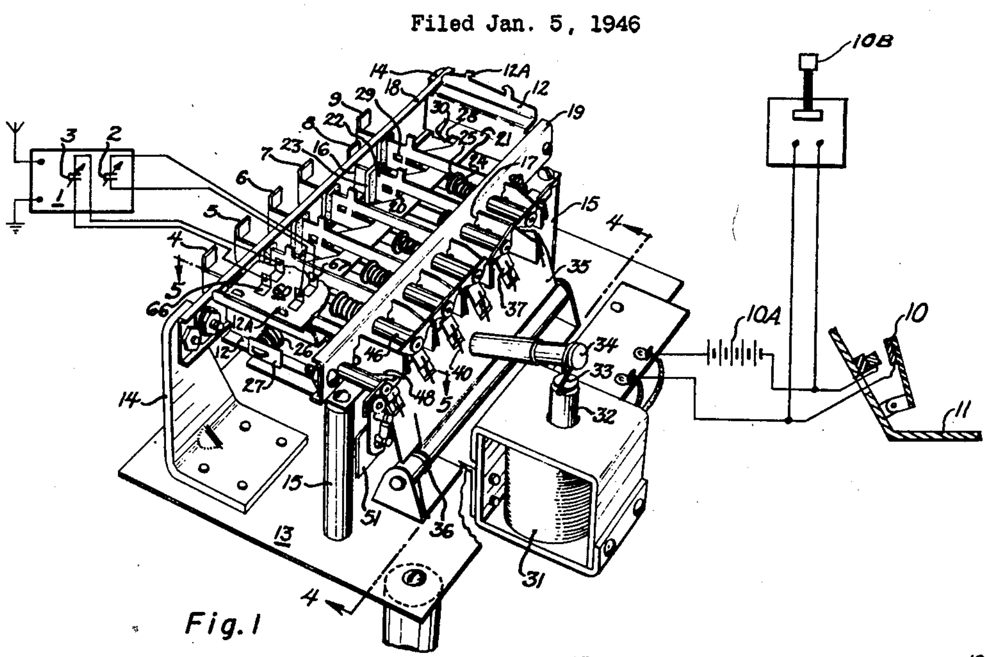
Figure 1 shows a view in perspective and circuit in diagrammatic form of a tuning mechanism for a radio receiver incorporating the present invention, for the sake of simplicity, detailed parts of the switches actuated by movement of the pushbutton rods, except pushbutton rod 4, are omitted since the detailed structure of such switches is shown more clearly in Figure 5.
Figures 2, 5:
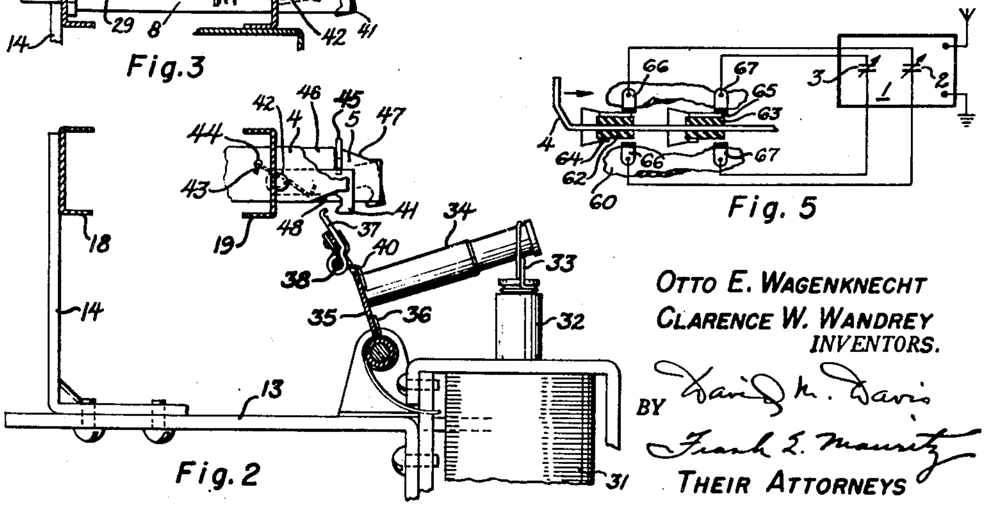
Figure 2 is a sectional view taken substantially on line 2—2 of Figure 4.

Figure 5 is a sectional view of a switch mechanism taken substantially on line 5—5 of Figure 1, it being understood that an identical switch structure is associated with each one of the other pushbutton rods 5–9 inclusive and actuated to insert or remove a pair of tuning condensers of the type shown in Figures 1 and 5.

The apparatus described herein is associated with radio reception in an automobile but it is apparent that the apparatus described is useful for radio reception elsewhere, for example in the home where an operator may sequentially tune a radio receiver from a remote point or selectively tune the receiver by pushing a desired one of a plurality of push buttons mounted within the radio cabinet.

In the drawings, the radio unit 1 including a plurality of present adjustable tuning condensers 2, 3, for each predetermined frequency to which the radio unit may be tuned, is tuned either selectively by operating one of the push button rods or manuals 4, 5, 6, 7, 8, 9, or sequentially by recurrent operation of a single control element 10 which may comprise a foot or knee operated switch mounted within controlling range of the leg of a driver of an automobile, for example, on the floorboard 11 of an automobile.

The push button rods or manuals 4–9 inclusive are of conventional construction and are found in the so-called present day push button types of radio. Provisions are incorporated in such construction for maintaining only that one of the push button rods which is actuated, for example, by a finger tip pushing operation and simultaneously releasing any push button rod which may have been previously actuated to allow it to move to inoperative position under the influence of a compression spring.

In addition to this conventional construction there is provided, according to this invention, solenoid actuated means directly coupled to the ends of the push button rods removed from the so-called push button end to individually and sequentially pull the push button rods 4–9 inclusive upon recurrent energization of the solenoid means.

The series of push button rods 4—9 inclusive are mounted for longitudinal movement on a frame construction 12 which in turn is mounted on fixed supporting member 13 by use of a pair of bracket members 14 and a pair of vertical rods 15.

For purposes of simplicity the constructional details of push button rod or manual 8 is described in detail it being understood that the other rods are constructed and mounted in the same manner as is push button rod 8. It is noted here that the right end of push button rod 4 in Figure 1 is shaped somewhat differently than are the other corresponding ends of push button rods 5–9 inclusive, which latter ends are all of the same form for a purpose described later in connection with the construction and operation of the solenoid actuated means.

The push button rod 8 is mounted for longitudinally guided movement respectively in spaced apertures 16, 17 formed in oppositely disposed channel members 18, 19 of frame 12, such longitudinal movement of rod 8 being limited in one direction by cooperation of the inner stop edge 20 thereof with a combination latching and releasing bar 21 which is mounted for movement in a direction perpendicular to the direction of movement of the push button rods as will be described later and such longitudinal movement of rod 8 being limited in the other direction by cooperation of shoulder 22 thereon with the edges defining apertures 16. It is noted that in order to reduce noise and prevent undue shock when the rod 8 is moved from its operative position shown in Figure 1 to its inoperative position exemplified by rod 9 in Figure 1 a resilient rectangular rubber pad 23 is threaded on rod 8 and interposed between shoulder 22 thereon and channel member 18, the resilient pad 23 in the case of rod 9 being normally compressed due to the action of compression spring 24 one end of which abuts the inside of channel member 19 and its other end abuts a suitable spring seat 25 carried on each one of the corresponding rods. It is evident from the construction thus far described that each one of the push button rods tend to move outwardly to the left in Figure 1 to the corresponding inoperative position thereof.

In order to maintain only that one of the push button rods which is actuated in operative position to the exclusion of others the combination latch and release bar 21 is mounted for longitudinal and guided movement on frame 12 in a direction perpendicular to the direction of movement of the push button rods, in which case the upper and lower ends of bar 21 in Figure 1 are guided in corresponding suitable operations in oppositely disposed members of frame 12. Compression spring 26 threaded on the lower guide end of latch bar 21 and retained in position between retainer strip 27 fastened to the latch bar and frame 12 normally biases the latch bar in a downward direction in Figure 1, such downward movement of latch bar 21 being normally limited by engagement of one of the push button rods therewith.

It is noted that the latch bar 21 is formed from a metal strip and has a series of reentrant portions each shaped to cooperate with corresponding push button rod to maintain it in operative position when it is actuated. Specifically, the latch bar 21 has a series of spaced latch projections 28 each adapted to enter into a corresponding aperture 29 in the corresponding latch bars to maintain the same in latched position. It is noted that each one of the projections 28 is defined in part by a cam surface 30 which is engaged by a corresponding edge 20 of a push button rod in the process of actuating the same thereby to cause upward movement of the latch bar 21 and thus withdrawal of any latch projection 28 which may have previously entered its corresponding aperture 29 to allow the corresponding push button rod to return to its normal inoperative released condition to the left in Figure 1. It is noted further that in the process of actuating a push button rod to its operative position to the right in Figure 1, after the corresponding edge 20 thereon cams the latch bar 21 upwardly to allow release of any one of the other push button rods which may have been actuated previously, further movement of the actuated push button to the right in Figure 1 results in the entrance of the corresponding latch projection 28 into aperture 29 of the actuated push button rod to maintain it in actuated position even though the force which initially caused movement of the actuated push button rod to the right in Figure 1 is removed. Such force may either have been transmitted to the actuated push button rod by a finger tip push operation or by the solenoid actuated means described presently.

It is thus evident from the apparatus thus far described that provisions are made for maintaining only one of a plurality of push button rods in actuated position to the exclusion of the other push button rods, and that upon actuation of any one of the push button rods to operative position all other push button rods are assured of being restored to normal inoperative position to the left in Figure 1.

It will be evident that the push button rods may be actuated either selectively by a finger tip push operation or by the solenoid actuated means which actuates such push button rods in sequence upon recurrent operation of control element 10. The closure of footswitch 10 or a hand operated switch 10B results in a current flow in the serially connected circuit comprising switch 10, automobile storage battery 10A and solenoid winding 31 which is fixedly mounted on supporting member 13.

The movable cooperating armature 32 magnetically associated with solenoid winding 31 is mechanically coupled by means of a flexible wire coupling 33 to one end of a lever member 34 the other end of which is mounted on a plate 35 which in turn is pivotally mounted at its lower end in Figure 1 on supporting member 13 and normally spring biased by coil spring 36 in a counterclockwise direction in Figure 1 thereby to normally maintain armature 32 in one of its extreme positions from where it may be moved under the influence of solenoid winding 31 to cause clockwise movement of the free end of pivoted plate 35 in a direction substantially parallel to the longitudinal direction of the push button rods.

Plate 35 has pivotally mounted thereon on its upper free end a plurality of individually movable spring biased fingers 37, spaced one for each push button rod. Each one of the fingers 37 is mounted for pivotal movement on a common hinge pin 38 which is fixedly mounted by means of clamps 39 or the like on the free end of plate 35. Each one of the fingers 37 is biased by means of its individual coil spring 40 in a counterclockwise direction in Figure 2 on its hinge pin 38, movement of such fingers in the counterclockwise direction being limited by the upper relatively large surface area of finger 37 contacting at the upper end thereof in Figures 1 and 2 the pivoted plate 35. These fingers 37 are arranged to move a relatively small distance only in a clockwise direction in Figure 2 when engaged by cooperating means (described later) carried individually on corresponding push button rods when the plate 35 is pivoted in a counterclockwise direction as to allow movement of plate 35 to its extreme counterclockwise position under all conditions.

Figure 3:
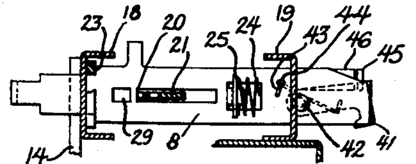
Figure 3 is a sectional view taken substantially on line 3—3 of Figure 4.

Each one of the fingers 37 is arranged to cooperate with a corresponding hook or latch member 41 pivotally mounted near the end of a corresponding push button rod, such hook member 41 being journaled on shoulder rivet 42 which is riveted in the fabrication process near the end of the corresponding push button rod after a coil spring 43 is coiled about it. One end of coil spring 43 is deformed to pass through a hole 44 in the corresponding push button rod to be suitably anchored thereon while the other end of the coil spring 43 is deformed to suitably hook the bottom edge of hooking member 41 to bias it upwardly in a counterclockwise direction in Figure 3. Movement of hooking member 41 in such counterclockwise direction is limited due to engagement therewith by a transfer lever 45 which is pivotally mounted at a point intermediate its ends on frame 12, one of the ends of transfer lever 45 being arranged to engage the upper surface of hooking member 41 mounted on one push button rod while the other end of transfer lever 45 being arranged to engage the upper surface of an adjacent push button rod as seen in Figures 1 and 4.

Each one of the transfer levers 45 is pivotally mounted on the frame 12 by means of a shoulder rivet 46, of which the enlarged intermediate body portion serves as a convenient spacer to space the transfer levers 45 at a predetermined point with respect to the ends of push button rods to cooperate not only with the upper straight surface of such push button rod but also to cooperate with the downwardly inclined cam surface 47 on push button rods 5, 6, 7, 8, 9. It is noted here that in the case of push button rod 4 the upwardly inclined cam surface 48 thereon serves the same function as does the corresponding cam surfaces 47 on push button rods 5–9 inclusive.

In order to provide a transfer lever (similar to transfer lever 45) between push button rod 4 and the hooking member 41 which is pivotally mounted on push button rod 9 there is provided a suitable linkage including as some parts thereof: pivoted lever 49, connecting link 50, and a second pivoted lever 51 which are cooperatively associated together with other elements. Lever 49 is pivoted at a point intermediate its ends on a lowered shoulder rivet 46 with one end of pivoted lever 49 arranged to engage the bottom surface (including cam surface 48) of push button rod 4 and the other end pin-connected to one end of link 50, the other end of link 50 being flexibly connected to one end of pivoted lever 51 by means of a pin and elongated slot arrangement 52 and a tension spring 53 interposed between pin 54 on link 50 and pin 55 on lever 51. This particular flexible connection between link 50 and pivoted lever 51 is desirable although not necessary in making devices of this character with relatively large tolerance in dimensions.

Figure 4:
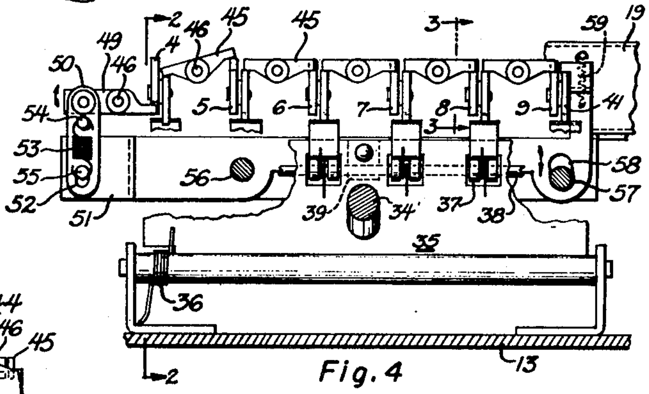
Figure 4 is a rear view in elevation and partly in section taken substantially on the line 4—4 of Figure 1.

Lever 51 is pivoted at a point 56 which is mounted in conventional manner on frame 12, the right end of lever 51 in Figure 4 being guided and limited in its movement by a pin 57 mounted on frame 12 cooperating with elongated slot 58 in lever 51. It is also seen in Figure 4 that the upper right end of lever 51 is hook shaped to contact the upper surface of hooking member 41 pivotally mounted on push button rod 9 and is fastened to one end of a tension spring 59 having its other end anchored on frame 12 to normally pull such end of lever 51 upward against combination guide and stop pin 57. It is apparent from the structure described that when and as one end of the pivoted lever 49 is cammed downwardly in a clockwise direction in Figure 4 by engagement therewith by the cam surface 48 on push button rod 4, the link 50 is moved upwardly the lever 51 is pivoted in a clockwise direction thereby to move the hook member 41 on push button rod 9 downwardly to a position where it may become engaged with a corresponding finger 37 carried on pivoted plate 35.

In the same manner it is seen from the structure thus far described that movement of one of the push button rods 5–9 inclusive to operative or actuated position results in downward movement of the hooking member 41 pivotally mounted on the adjacent push button rod having a smaller reference character. When push button rod 4 is moved to operative or actuated position the hooking member 41 on push button rod 9 is moved downwardly. In other words, when push button rod 9 is actuated the hooking member 41 on rod 8 is positioned for engagement with its corresponding finger 37 on pivoted plate 35, when push button rod 8 is actuated the hooking member 41 on rod 7 is positioned for engagement with its corresponding finger 37 on pivoted plate 35, etc., and when push button rod 4 is actuated the hooking member 41 on rod 9 is positioned for engagement with its corresponding finger 37 on pivoted plate 35 to complete a sequential tuning cycle, it being noted that when, for example, the hooking member 41 on push button rod 4 is positioned for engagement with its corresponding finger 37 on plate 35 energization of solenoid 31 will cause movement of such finger 37 into engagement with hooking member 41 on push button rod 4 to move push button rod 4 to operative position and simultaneously position hooking member 41 on push button rod 9 for engagement with its corresponding finger 37 and that upon subsequent deenergization of solenoid 31 the plate 35 is moved under the influence of coil spring 36 to the left in Figure 1 to its normal position but in such resulting return movement of plate 35 its movement is not prevented by engagement between hooking member 41 on push button rod 9 since the corresponding finger 37 is spring biased and pivotally mounted on plate 35 as described previously to form a one-way hook engaging member.

It is readily apparent that operation of the push button rods 4–9 inclusive by finger tip pushing engagement therewith in no way interferes with operation produced by energizing the solenoid actuating means and vice versa. It is readily apparent also that recurrent operation of the solenoid actuated means will produce individual sequential operation of the push button rods or manuals 4–9 inclusive in predetermined order for example the order is in descending order—9, 8, 7, 6, 5, 4, 9, 8, 7, 6, 5 etc. It is also readily apparent that regardless of the particular push button rod which is in actuated position an operator, by a finger tip pushing operation, may selectively move any particular push button rod to operative position and, for example, if the operator desires to and does move push button rod 8 to operative position by a finger tip pushing operation directly on the particular push button rod 8 selected, subsequent energization and deenergization of the solenoid actuated means will result in movement of the adjacent push button rod 7 to operative position.

The radio receiver 1 is provided with a pair of connectable and disconnectable adjustable tuning condensers 2, 3 for selectively receiving one of a plurality of desired frequencies, it being understood that there is a pair of such condensers associated with each push button rod and that when a particular push button rod 4–9 inclusive is in its fully actuated position to the right in Figure 1 only its corresponding pair of tuning condensers is connected in the radio circuit 1 to selectively tune the same for the reception of a predetermined signal frequency. The condenser 2 may be used to tune a radio frequency stage of the superheterodyne receiver 1 while simultaneously the condenser 3 may be used to tune the oscillator modulator stage of such superheterodyne receiver 1.

It is, therefore, understood that a description of the particular switches associated with push button rod 4 indicated in Figure 1 and shown in more detail in Figure 5 will suffice for the description of the other identical switches associated with and actuated by movement of the other push button rods 5—9.

Thus, as indicated in Figure 5, each one of the push button rods, particularly rod 4, has mounted thereon a pair of spaced insulating members 62, 63 which have in turn mounted thereon respectively a metallic short circuiting bar 64, 65.

Thus, the two spaced short circuiting bars 64, 65 are moved simultaneously with movement of the corresponding push button rod upon which it is insulatingly mounted. Each one of these two short circuiting bars, 64, 65 are arranged to bridge a pair of spaced terminals 66, 67, the terminals 66 being serially connected with adjustable tuning condenser 3 in receiver 1 and the terminals 67 being serially connected with adjustable tuning condenser 2 in radio receiver 1. It is noted that the terminals 66, 67 are stationarily mounted by, for example, rivets or the like on a sheet of insulation 68 which in turn is mounted by engagement therewith of suitable ears 12A of frame 12. It is understood that when the push button rod 4 is in its inoperative position to the left in Figures 1 and 5 the corresponding condensers 2, 3 are disconnected from the radio receiver but when such push button rod 4 is held in operative position to the right in Figures 1 and 5 the terminals 66, 67 are individually circuited and correspondingly the radio receiver is tuned to the frequency determined by the value of capacitance in condensers 2 and 3 which in practice as is well known may be of the type adjustable by means of a screw driver or the like.

It is apparent that the radio set shown may be tuned sequentially at a point remote therefrom. For example, the switch shown in the drawings may be a hand operated switch such as 10B located in some convenient spot accessible to one riding in the rear seat of a limousine, taxicab or the like, or an auxiliary normally open switch connected electrically in shunt to said footswitch may be located at such rear seat and in the latter case the radio set may be tuned sequentially by either the driver of the automobile or by a passenger sitting on the rear seat of such automobile.

It is apparent also that while the tuning elements are shown for exemplification as a condenser, such tuning elements may comprise either condensers or inductances.

While we have shown and described certain particular embodiments of our invention, it will be obvious to those skilled in the art that changes and modifications may be made without departing from our invention in its broader aspects, and we, therefore, aim in the appended claims to cover all such changes and modifications as fall within the true spirit and scope of our invention.

We claim:

1. A control assembly for radio apparatus and the like comprising: a plurality of manually operable control members for effecting selective tuning of said apparatus to a plurality of predetermined settings; an actuating arm for effecting sequential tuning of said apparatus to said predetermined settings; a plurality of pivotal latch members respectively mounted on said control members; and a plurality of pivotal transfer levers respectively engaging said control members and said latch members for causing said latch members sequentially to engage said actuating arm.

2. A control assembly for radio apparatus and the like comprising: a plurality of manually operable control members for effecting selective tuning of said apparatus to a plurality of predetermined frequencies; an actuating arm for effecting sequential tuning of said apparatus to said predetermined frequencies; a plurality of pivotal latch members respectively mounted on said control members; a plurality of pivotal transfer levers respectively engaging said control members and said latch members for causing said latch members sequentially to engage said actuating arms; and electro-magnetic means for controlling said actuating arm upon repeated energization of said means.

3. A control assembly for radio apparatus and the like comprising: a frame structure; a plurality of manually operable control members mounted for selective reciprocal movement in said frame structure to effect selective tuning of said apparatus to a plurality of predetermined frequencies; an actuating arm for imparting sequential reciprocal movement to said control members; a plurality of pivotal latch members respectively mounted on said control members; a plurality of pivotal transfer levers mounted on said frame structure and respectively engaging said control members and said latch members for causing said latch members sequentially to engage said actuating arm; and electro-magnetic means for controlling said actuating arm upon repeated energization of said means.

4. A control assembly for radio apparatus and the like comprising: a frame structure; a plurality of manually operable control members mounted for selective reciprocal movement in said frame structure to effect tuning of said apparatus to a plurality of predetermined frequencies; resilient means associated with said control members for urging said members from an operative to an inoperative position; an actuating arm for imparting sequential movement to said control members into said operative position; a plurality of pivotal latch members respectively mounted on said control members; a plurality of pivotal transfer levers mounted on said frame structure for individually linking each of said control members with each of said latch members to cause said latch members sequentially to engage said actuating arm; and electro-magnetic means for controlling said actuating arm upon repeated energization of said means.

OTTO E. WAGENKNECHT.
CLARENCE W. WANDREY.

REFERENCES CITED

The following references are of record in the file of this patent:

UNITED STATES PATENTS

| Number | Name | Date |
|---|---|---|
| 2,310,720 | Wandrey | Feb. 9, 1943 |
| 2,389,213 | Schwarz | Nov. 20, 1945 |
| 2,435,522 | Wagenknecht | Feb. 3, 1948 |